United States Patent
Yang

(10) Patent No.: US 11,112,661 B2
(45) Date of Patent: Sep. 7, 2021

(54) METHOD FOR MANUFACTURING DISPLAY PANEL, DISPLAY PANEL, AND DISPLAY DEVICE

(71) Applicant: HKC CORPORATION LIMITED, Shenzhen (CN)

(72) Inventor: Chunhui Yang, Chongqing (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 17/042,072

(22) PCT Filed: Dec. 7, 2018

(86) PCT No.: PCT/CN2018/119673
§ 371 (c)(1),
(2) Date: Sep. 25, 2020

(87) PCT Pub. No.: WO2020/098022
PCT Pub. Date: May 22, 2020

(65) Prior Publication Data
US 2021/0063828 A1    Mar. 4, 2021

(30) Foreign Application Priority Data

Nov. 14, 2018   (CN) .......................... 201811350592.4

(51) Int. Cl.
*G02F 1/1362*   (2006.01)
*G02F 1/1333*   (2006.01)
(Continued)

(52) U.S. Cl.
CPC .. *G02F 1/136209* (2013.01); *G02F 1/133345* (2013.01); *G02F 1/133512* (2013.01);
(Continued)

(58) Field of Classification Search
CPC ......... G02F 1/133512; G02F 1/133514; G02F 1/136209; G02F 1/136286; G02F 1/1368;
(Continued)

(56) References Cited

U.S. PATENT DOCUMENTS

| 2016/0018708 | A1* | 1/2016 | Kanda | G02F 1/134309 257/254 |
| 2017/0184915 | A1* | 6/2017 | Yang | G02F 1/136286 |
| 2018/0120631 | A1* | 5/2018 | Lee | G02B 5/20 |

FOREIGN PATENT DOCUMENTS

| CN | 1936660 A | 3/2007 |
| CN | 102236228 A | 11/2011 |

(Continued)

OTHER PUBLICATIONS

Yuzhan Yao, the ISA written comments, Aug. 2019, CN.
Yuzhan Yao, the International Search Report, dated Aug. 2019, CN.

*Primary Examiner* — Mariam Qureshi

(57) ABSTRACT

This application discloses a method for manufacturing a display panel, a display panel, and a display device. The display panel includes a first substrate; a second substrate, cell-assembled to the first substrate; and a plurality of data lines and scanning lines, arranged on the first substrate. The first substrate includes a first shading layer blocking the data lines or the scanning lines; the second substrate includes a second shading layer blocking the data lines or the scanning lines; and each of the data lines and the scanning lines is blocked by at least one of the first shading layer and the second shading layer.

10 Claims, 13 Drawing Sheets

(51) Int. Cl.
*G02F 1/1335* (2006.01)
*H01L 27/12* (2006.01)
(52) U.S. Cl.
CPC .... *G02F 1/133514* (2013.01); *H01L 27/1214* (2013.01); *G02F 2201/121* (2013.01); *G02F 2201/123* (2013.01)
(58) Field of Classification Search
CPC ............ G02F 1/136295; G09G 3/3648; G09G 2300/0426; G09G 2300/0421; G09G 2310/0281
See application file for complete search history.

(56) References Cited

FOREIGN PATENT DOCUMENTS

| | | | |
|---|---|---|---|
| CN | 202522819 | U | 11/2012 |
| CN | 104267530 | A | 1/2015 |
| CN | 104465675 | A | 3/2015 |
| CN | 104865730 | A | 8/2015 |
| CN | 106200169 | A | 12/2016 |
| CN | 106707596 | A | 5/2017 |
| JP | 2018136477 | A | 8/2018 |

* cited by examiner

METHOD FOR MANUFACTURING DISPLAY PANEL, DISPLAY PANEL, AND DISPLAY DEVICE

CROSS REFERENCE OF RELATED APPLICATIONS

This application claims the priority to the Chinese Patent Application No. CN201811350592.4, filed with National Intellectual Property Administration, PRC on Nov. 14, 2018 and entitled "METHOD FOR MANUFACTURING DISPLAY PANEL, DISPLAY PANEL, AND DISPLAY DEVICE", which is incorporated herein by reference in its entirety.

TECHNICAL FIELD

This application relates to the field of display technologies, and in particular, to a method for manufacturing a display panel, a display panel, and a display device.

BACKGROUND

Statement herein merely provides background information related to this application and does not necessarily constitute the existing technology.

With development and advancement of science and technologies, due to hot spots such as thinness, power saving, and low radiation, flat crystal displays become mainstream products of displays and are widely applied. A flat panel display includes a thin film transistor-liquid crystal display (TFT-LCD), an organic light-emitting diode (OLED) display, and the like. The TFT-LCD controls rotating directions of liquid crystal molecules, to enable light in a backlight module to be refracted out to generate a picture, and the TFT-LCD has various advantages such as thin body, power saving, and no radiation.

A display panel of a display includes an array substrate and a color filter substrate. In the manufacturing process of the display panel, a cell-assembly error is likely introduced in a process of cell-assembling the array substrate and the color filter substrate, resulting in light leakage, affecting display effects and reducing the yield of the display panel.

SUMMARY

An objective of this application is to provide a method for manufacturing a display panel, a display panel, and a display device to prevent light leakage of the display panel and improve the yield of the display panel.

To achieve the foregoing objective, this application provides a display panel, including: a first substrate; a second substrate, cell-assembled to the first substrate; and a plurality of data lines and scanning lines, arranged on the first substrate. The first substrate includes a first shading layer blocking the data lines or the scanning lines; the second substrate includes a second shading layer blocking the data lines or the scanning lines; and each of the data lines and the scanning lines is blocked by at least one of the first shading layer and the second shading layer.

Optionally, the first shading layer is arranged to block all of the data lines and the scanning lines in a one-to-one correspondence; the second shading layer is arranged to block all of the data lines and the scanning lines in a one-to-one correspondence; and the first shading layer is arranged corresponding to the second shading layer.

Optionally, the first shading layer and the second shading layer have a same shape and a same size.

Optionally, the second substrate includes a plurality of color filters, and the second shading layer is arranged between two neighboring color filters; the first substrate includes a plurality of pixels, the pixel includes a pixel electrode, and the data lines and the scanning lines are arranged between two neighboring pixel electrodes; and the second shading layer is arranged to correspondingly block the data lines or the scanning lines.

Optionally, the pixel includes a first pixel, and one of the data lines is arranged on an outer side of the first pixel; the first pixel includes a first pixel electrode and a first common electrode line arranged on an outer side of the first pixel electrode, and the first common electrode line and the first pixel electrode are on different layers and partially overlap each other; the first common electrode line is arranged on a side of the data line, and a first gap is arranged between the first common electrode line and the data line; and the first shading layer blocks the data line, the first gap, and the first common electrode line, and extends beyond an edge of the first common electrode line close to the first pixel electrode.

Optionally, the pixel includes a second pixel neighboring the first pixel, the second pixel includes a second pixel electrode, and the data line is arranged between the first pixel electrode and the second pixel electrode; the second pixel further includes a second common electrode line arranged between the first pixel electrode and the second pixel electrode, and the second common electrode line and the second pixel electrode are on different layers and partially overlap each other; the second common electrode line is arranged on a side of the data line away from the first common electrode line, and a second gap is arranged between the second common electrode line and the data line; and the first shading layer further blocks the second gap and the second common electrode line, and extends beyond an edge of the second common electrode line close to the second pixel electrode.

Optionally, the first substrate includes a plurality of pixels, the scanning lines is arranged corresponding to the pixel, and the pixel includes a thin film transistor switch connected to the scanning line; and the first shading layer further blocks the scanning lines and the thin film transistor switch.

Optionally, the first substrate includes a plurality of data lines and a plurality of scanning lines; the first shading layer is arranged on a side of the first substrate to block the data lines; and the second shading layer is arranged on a side of the second substrate to block the scanning lines.

To achieve the foregoing objective, this application further provides a method for manufacturing a display panel, including:

forming a first substrate including data lines and scanning lines;

forming a first shading layer above the data lines and/or the scanning lines;

forming a second substrate including a second shading layer; and cell-assembling the first substrate and the second substrate, so that the second shading layer correspondingly blocks the data lines and/or the scanning lines.

To achieve the foregoing objective, this application further provides a display device, including the foregoing display panel.

Compared with the solution in which the shading layer is arranged only on the first substrate or the second substrate, in this application, the first shading layer is arranged on the first substrate, the second shading layer is arranged on the second substrate, and each of the data lines and the scanning lines is blocked by at least one of the first shading layer and the second shading layer, so that when the first substrate and the second substrate are cell-assembled, the first shading layer on the first substrate can shade the part that needs to be shaded on the first substrate, and the second shading layer on the second substrate can shade the part that needs to be shaded on the second substrate, thereby avoiding light leakage resulting from misalignment between the shading layer and the part that needs to be shaded on the first substrate or the second substrate due to a cell-assembly error.

BRIEF DESCRIPTION OF DRAWINGS

The included accompanying drawings are used to provide further understanding of the embodiments of this application, constitute a part of the specification, and are used to illustrate implementations of this application and explain the principle of this application together with literal descriptions. Apparently, the accompanying drawings in the following descriptions are merely some embodiments of this application, and a person of ordinary skill in the art can also obtain other accompanying drawings according to these accompanying drawings without involving any creative effort. In the accompanying drawings.

DETAILED DESCRIPTION OF EMBODIMENTS

Figure 1:
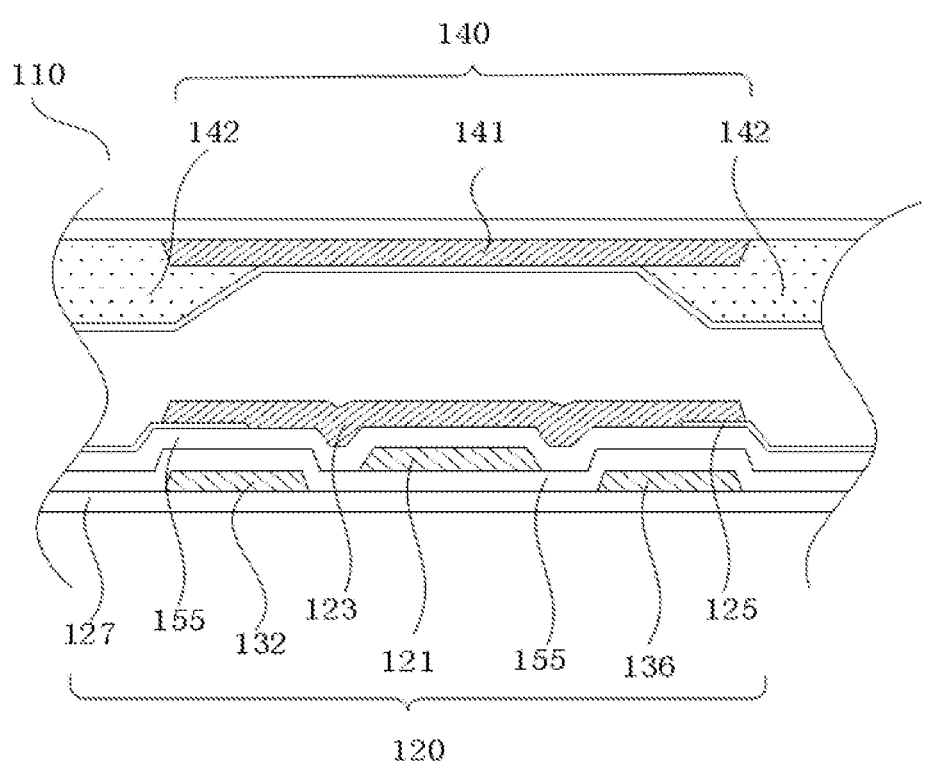
FIG. 1 is a schematic cross-sectional view of a display panel according to an embodiment of this application.
Figure 2:
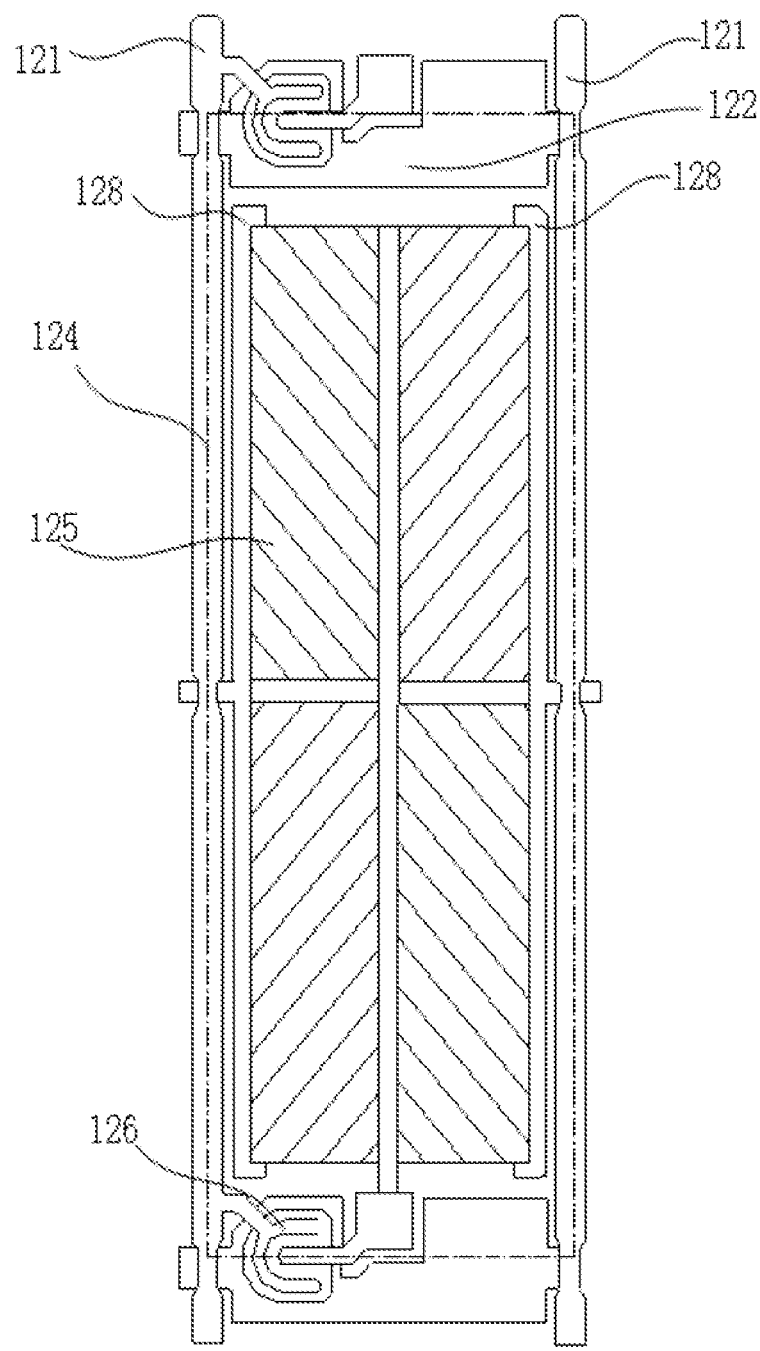
FIG. 2 is a schematic diagram of a single pixel according to an embodiment of this application.
Figure 3:
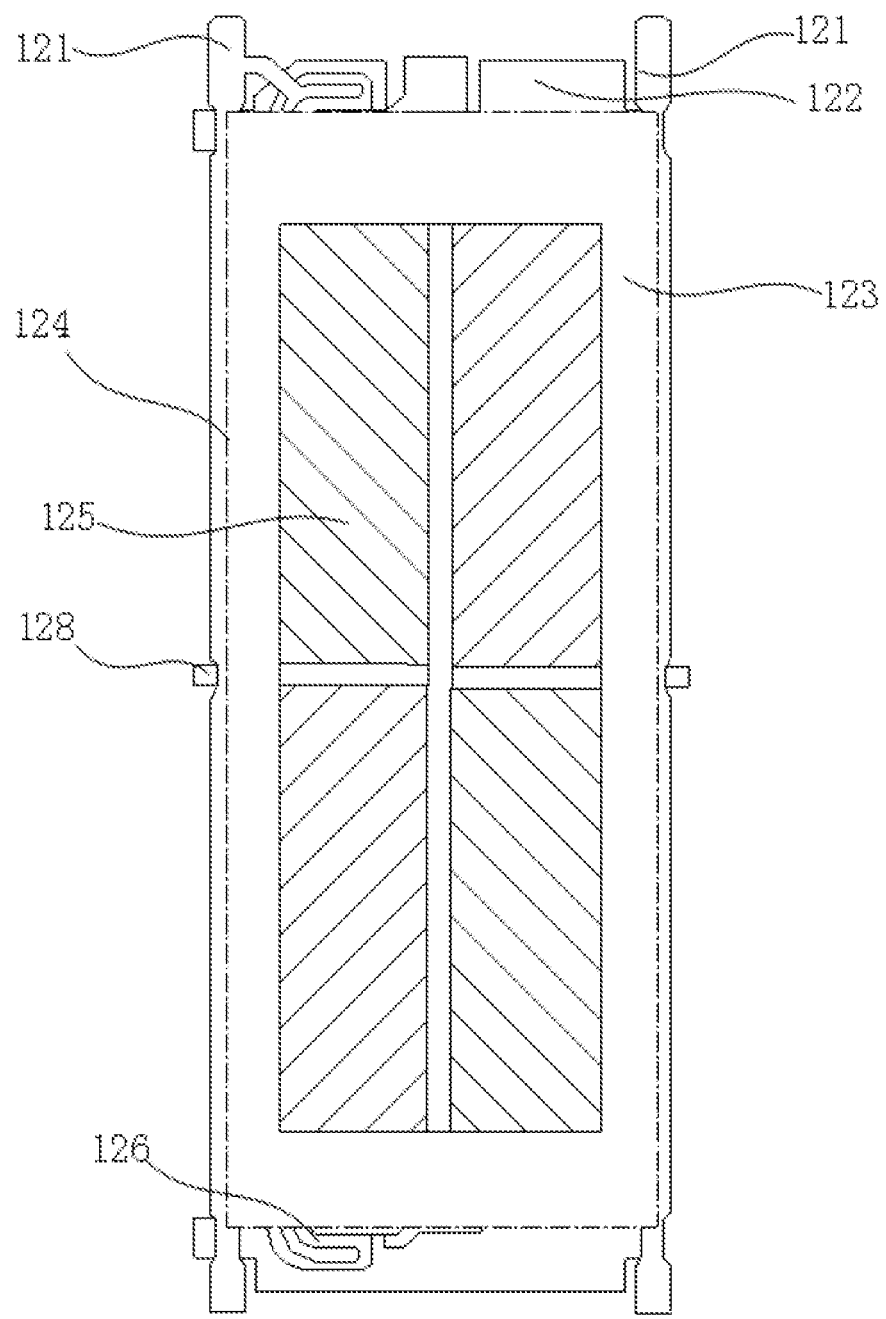
FIG. 3 is a schematic diagram of another single pixel according to an embodiment of this application.
Figure 4:
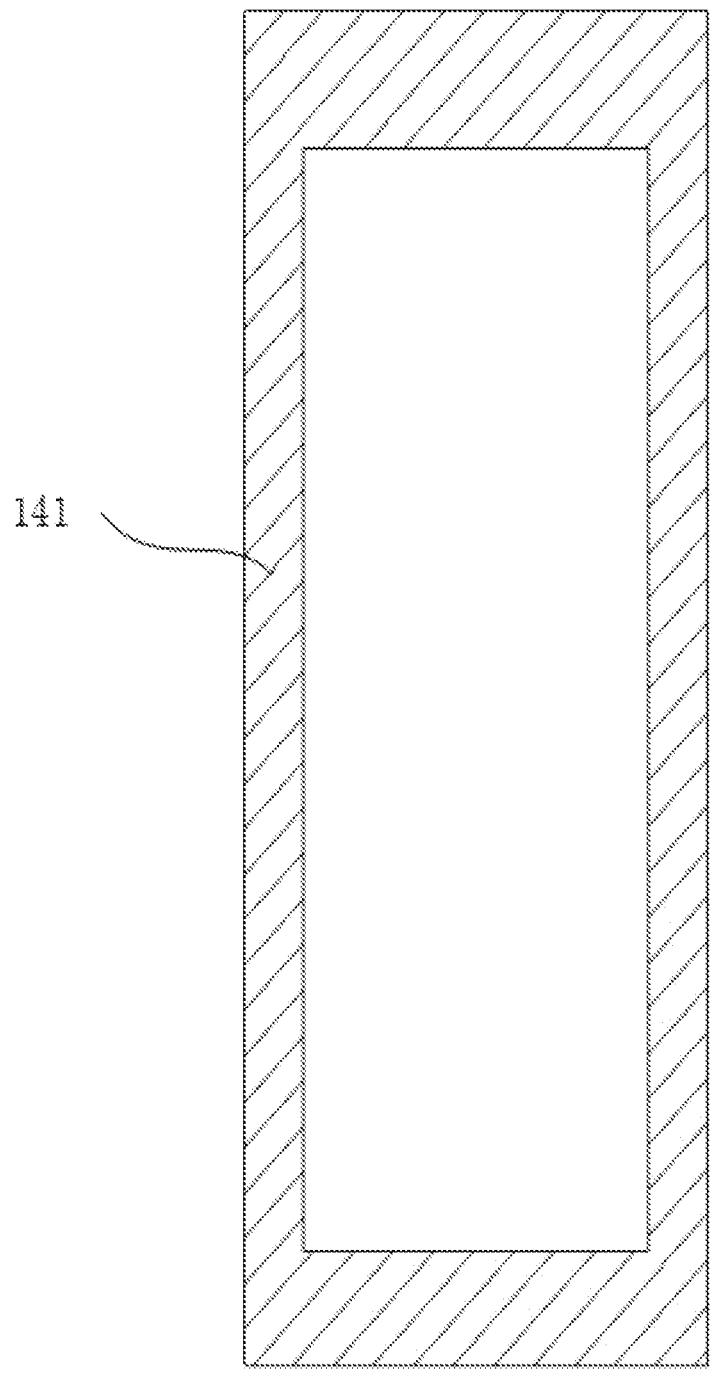
FIG. 4 is a schematic diagram of a second shading layer according to an embodiment of this application.
Figure 5:
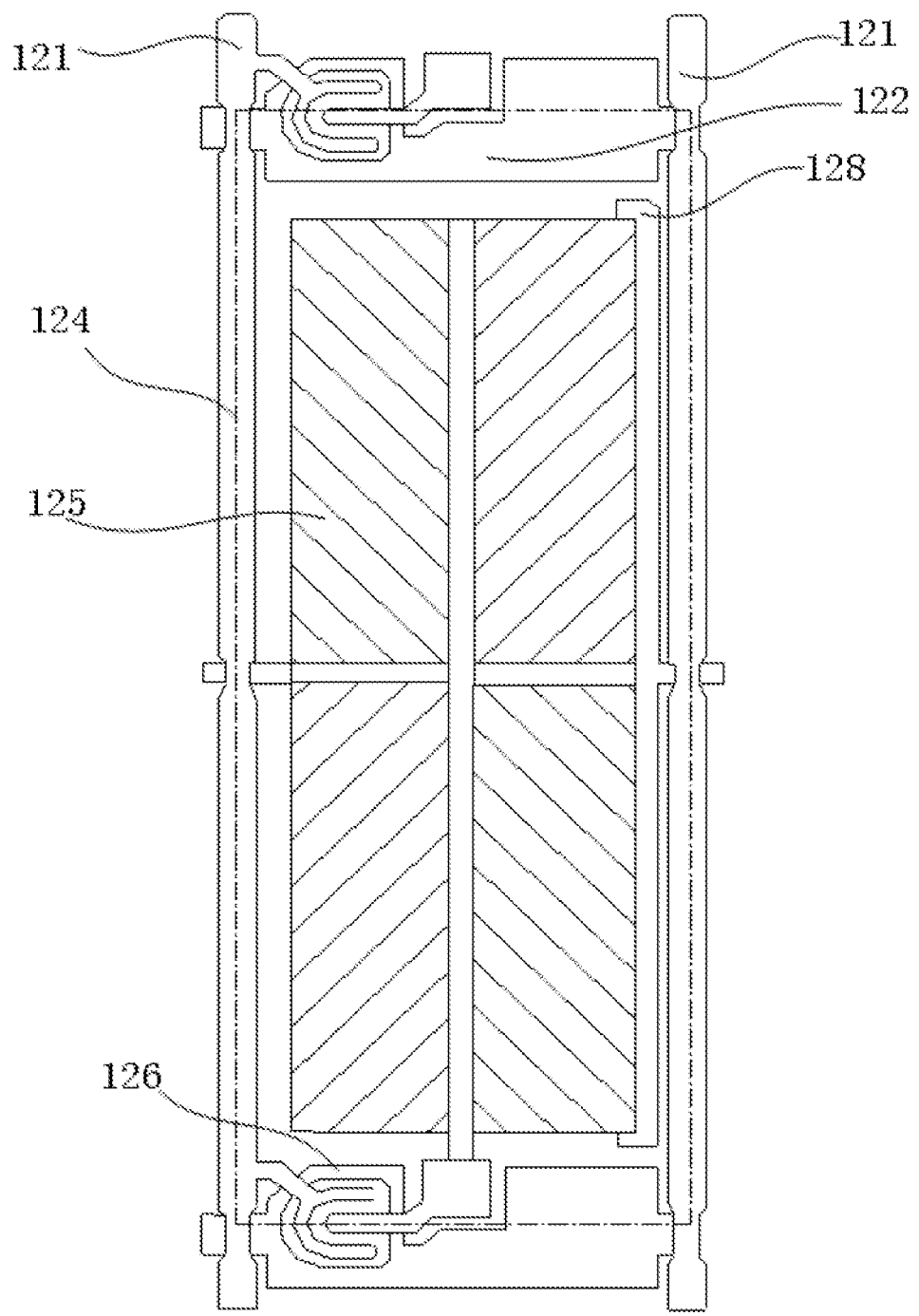
FIG. 5 is a schematic diagram of another single pixel according to an embodiment of this application.
Figure 6:
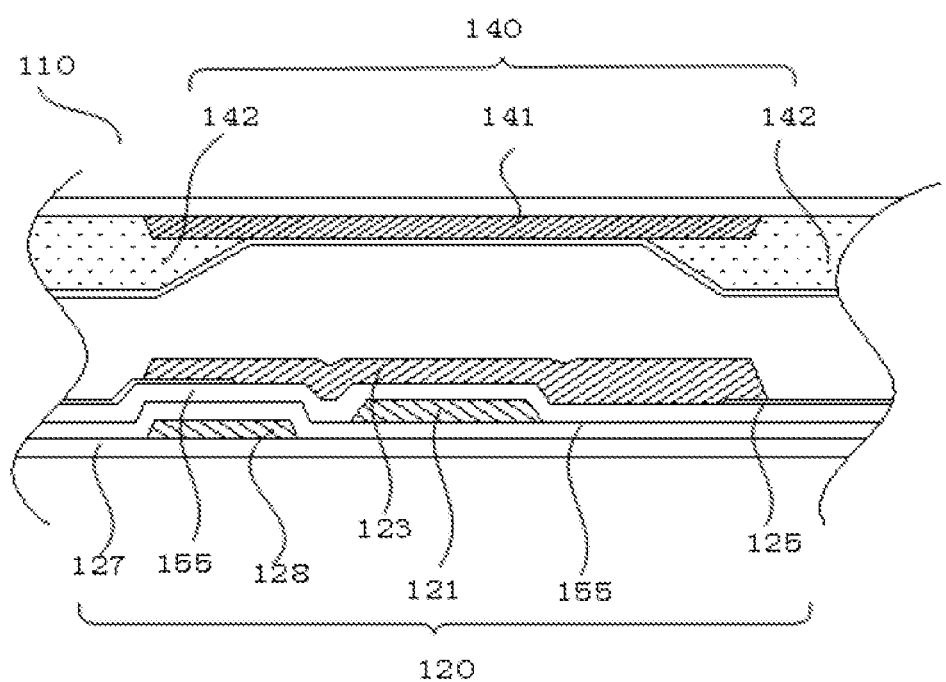
FIG. 6 is a schematic cross-sectional view of another display panel according to an embodiment of this application.

Specific structures and functional details disclosed herein are merely representative, and are intended to describe the objectives of the exemplary embodiments of this application. However, this application may be specifically implemented in many alternative forms, and should not be construed as being limited to the embodiments set forth herein.

In the description of this application, it should be understood that orientation or position relationships indicated by the terms such as "center", "transverse", "on", "below", "left", "right", "vertical", "horizontal", "top", "bottom", "inside", and "outside" are based on orientation or position relationships shown in the accompanying drawings, and are used only for ease and brevity of illustration and description, rather than indicating or implying that the mentioned apparatus or component must have a particular orientation or must be constructed and operated in a particular orientation. Therefore, such terms should not be construed as limiting of this application. In addition, the terms such as "first" and "second" are used only for the purpose of description, and should not be understood as indicating or implying the relative importance or implicitly specifying the number of the indicated technical features. Therefore, a feature defined by "first" or "second" can explicitly or implicitly includes one or more of said features. In the description of this application, unless otherwise stated, "a plurality of" means two or more than two. In addition, the terms "include", "comprise" and any variant thereof are intended to cover non-exclusive inclusion.

In the description of this application, it should be noted that unless otherwise explicitly specified or defined, the terms such as "mount", "install", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediary, or internal communication between two components. Persons of ordinary skill in the art may understand the specific meanings of the foregoing terms in this application according to specific situations.

The terminology used herein is for the purpose of describing specific embodiments only and is not intended to be limiting of exemplary embodiments. As used herein, the singular forms "a", "an" and "the" are intended to include the plural forms as well, unless the context clearly indicates otherwise. It should be further understood that the terms "include" and/or "comprise" when used in this specification, specify the presence of stated features, integers, steps, operations, elements, and/or components, but do not preclude the presence or addition of one or more other features, integers, steps, operations, elements, components, and/or combinations thereof.

In the manufacturing process of a liquid crystal display, an array substrate has five manufacture procedures, namely, a first metal layer manufacture procedure, an amorphous silicon layer manufacture procedure, a second metal layer manufacture procedure, a passivation layer manufacture procedure, and a transparent conductive thin film manufacture procedure, and requires five masks; a color filter substrate has five manufacture procedures, namely, a black matrix layer manufacture procedure, a red color filter manufacture procedure, a green color filter manufacture procedure, a blue color filter manufacture procedure, and a spacer manufacture procedure, and requires five masks. The function of the black matrix layer manufacture procedure of the color filter substrate is to block scattered light of a liquid crystal layer, prevent color mixing between sub-pixels, and prevent ambient light from illuminating a thin film transistor channel, and prevent light leakage caused by disturbed liquid crystal orientation due to a disturbed electric field near data lines and scanning lines. However, in an actual manufacturing process, especially in an process of cell-assembling the array substrate and the color film substrate, misalignment between the black matrix layer and the common electrode on the array substrate easily occurs, which leads to light leakage between the common electrode line and the data line, greatly affecting the product yield. Increasing the width of the black matrix layer resolve this problem but will reduce the product transmittance. Therefore, there is an urgent need of a novel pixel architecture design on the premise of ensuring the transmittance.

This application is further described below with reference to the accompanying drawings and optional embodiments.

As shown in FIG. 1 to FIG. 4, an embodiment of this application discloses a display panel 110, including a first substrate 120; a second substrate 140, cell-assembled to the first substrate 120; and a plurality of data lines 121 and scanning lines 122, arranged on the first substrate 120. The first substrate 120 includes a first shading layer 123 blocking the data lines 121 or the scanning lines 122. The second substrate 140 includes a second shading layer 141 blocking the data lines 121 or the scanning lines 122. Each of the data lines 121 and the scanning lines 122 is blocked by at least one of the first shading layer 123 and the second shading layer 141.

Specifically, the first substrate 120 is an array substrate and the second substrate 140 is a color filter substrate.

In an exemplary solution, the shading layer blocking the data lines 121 or the scanning lines 122 may all be arranged on the second substrate 140. For such a design, the shading layer may fail to block the data line 121 or the scanning line 122 because of misalignment that occurs when the first substrate 120 and the second substrate 140 are cell-assembled, leading to light leakage. If only the shading layer arranged on the second substrate 140 is widened or lengthened, the effective transmittance area of the display panel 110 will be reduced, and the light transmittance will also be reduced, affecting the display effect of the display panel 110. In this solution, not only the second shading layer 141 is arranged on the second substrate 140, but also the first shading layer 123 is arranged on the first substrate 120, so that no matter whether the first shading layer 123 is arranged in a one-to-one correspondence with the data line 121 and the scanning line 122, the first shading layer 123 can accurately block the data line 121 or the scanning line 122, thereby alleviating the light leakage problem that occurs when the first substrate 120 and the second substrate 140 are misaligned with each other.

That the first substrate 120 includes the first shading layer 123 blocking the data lines 121 or the scanning lines 122 and the second substrate 140 includes the second shading layer 141 blocking the data lines 121 or the scanning lines 122 includes three cases. In a first case, all the data lines 121 or the scanning lines 122 are blocked by both the two shading layers. In a second case, some of the data lines 121 is blocked by the first shading layer 123, and the other data lines 121 are blocked by the second shading layer 141. In a third case, some of the data lines 121 or the scanning lines 122 are blocked by the first shading layer 123, some are blocked by the second shading layer 141, and some are blocked by the two shading layers, as long as each of the data lines 121 and the scanning lines 122 is blocked by at least one of the first shading layer 123 and the second shading layer 141.

Compared with the solution in which the shading layer is arranged only on the first substrate 120 or the second substrate 140, in this application, the first shading layer 123 is arranged on the first substrate 120, the second shading layer 141 is arranged on the second substrate 140, and each of the data lines 121 and the scanning lines 122 is blocked by at least one of the first shading layer 123 and the second shading layer 141, so that when the first substrate 120 and the second substrate 140 are cell-assembled, the first shading layer 123 on the first substrate 120 can shade the part that needs to be shaded on the first substrate 120, and the second shading layer 141 on the second substrate 140 can shade the part that needs to be shaded on the second substrate 140, thereby avoiding light leakage resulting from misalignment between the shading layer and the part that needs to be shaded on the first substrate 120 or the second substrate 140 due to a cell-assembly error, and improving the yield of the display device 100.

In one or more embodiments, the first shading layer 123 is arranged to block all of data lines 121 and scanning lines 122 in a one-to-one correspondence; the second shading layer 141 is arranged to block all of the data lines 121 and the scanning lines 122 in a one-to-one correspondence; and the first shading layer 123 is arranged corresponding to the second shading layer 141.

In this solution, the position of the first shading layer 123 corresponds roughly to the position of the second shading layer 141, and the data lines 121 and the scanning lines 122 are blocked by the two shading layers, thereby avoiding light leakage caused by misalignment of the data lines 121 or the scanning lines 122 and the shading layers due to a cell-assembly error. However, the main function of the first shading layer 123 is to block the data lines 121 and the scanning lines, the main function of the second shading layer 141 is to prevent color mixing between the color filters 142, and the secondary function of the second shading layer 141 is to block the data lines 121 and the scanning lines. Therefore, the first shading layer 123 and the second shading layer 141 may have different shapes and sizes. Certainly, the first shading layer 123 and the second shading layer 141 may also have a same shape and a same size.

In one or more embodiments, the first shading layer 123 and the second shading layer 141 have a same shape and a same size. The shapes and sizes of the first shading layer 123 and the second shading layer 141 are generally designed to be the same, but may be different in practical manufacture procedures. Even if there is a slight difference between the shapes or sizes of the first shading layer 123 and the second shading layer 141, it is considered that the first shading layer 123 and the second shading layer 141 have the same shape or size as long as the difference does not exceed a threshold. When the first shading layer 123 and the second shading layer 141 have a same shape and a same size, the data lines 121 and the scanning lines can be well blocked, and the first shading layer 123 and the second shading layer 141 can share the same mask in the process, thereby avoiding using two masks and reducing the production costs.

As another embodiment of this application, referring to FIG. 5 to FIG. 11, different from the foregoing embodiments, the second substrate 140 includes a plurality of color filters 142, and the second shading layer 141 is arranged between two neighboring color filters 142. The first substrate 120 includes a plurality of pixels 124, the pixel 124 includes a pixel electrode 125, and data lines 121 and scanning lines 122 are arranged between two neighboring pixel electrodes 125. The second shading layer 141 is arranged to correspondingly block the data lines 121 or the scanning lines 122.

Specifically, the pixel electrode 125 is formed by a transparent conductive thin film.

In this solution, the first shading layer 123, the data lines 121 and the scanning lines 122 are all on the first substrate 120, and the first shading layer 123 is arranged accurately corresponding to the data lines 121 or the scanning lines 122, thereby effectively avoiding light leakage at the position of the data lines 121 or the scanning lines 122. The second shading layer 141 is correspondingly arranged accurately at the gap between the two neighboring color filters 142, thereby preventing color mixing.

In one or more embodiments, the pixel 124 includes a first pixel 130, and one of the data lines 121 is arranged on an outer side of the first pixel 130. The first pixel 130 includes a first pixel electrode 131 and a first common electrode line 132 arranged on an outer side of the first pixel electrode 131, and the first common electrode line 132 and the first pixel electrode 131 are on different layers and partially overlap each other. The first common electrode line 132 is arranged on a side of the data line 121, and a first gap 133 is arranged between the first common electrode line 132 and the data line 121. The first shading layer 123 blocks the data line 121, the first gap 133, and the first common electrode line 132, and extends beyond an edge of the first common electrode line 132 close to the first pixel electrode 131.

In this solution, the first shading layer 123 blocks the data line 121, the first gap 133, and the first common electrode line 132, and extends beyond an edge of the first common electrode line 132 close to the first pixel electrode 131. The first common electrode line 132 and the first pixel electrode 131 that are on different layers and partially overlap each other generate an electric field shielding effect, and correspondingly, no deflection of liquid crystals in this overlap area occurs. To prevent dark or bright fringes from being displayed on the overlap area of the first common electrode line 132 and the first pixel electrode 131, the overlap area needs to be blocked by a shading layer. Therefore, the first shading layer 123 blocks the first common electrode line 132, and extends beyond the edge of the first common electrode line 132 close to the first pixel electrode 131. Light leakage easily occurs at the first gap 133 due to misalignment during cell-assembly of the first substrate 120 and the second substrate 140. To resolve this problem, the first shading layer 123 blocks the first gap 133 between the first common electrode line 132 and the data line 121.

Specifically, the first shading layer 123 may be arranged above the first pixel electrode 131 or below the first common electrode line 132. The two different structures correspond to different processes. When the first shading layer 123 is arranged below the first common electrode line 132, the first shading layer 123 only has a blocking function. When the first shading layer 123 is arranged above the first pixel electrode 131, the first shading layer 123 not only has a blocking function, but also acts as a planarization layer, and provides a position for placement of a supporting structure between the first substrate 120 and the second substrate 140.

In one or more embodiments, the pixel 124 includes a second pixel 134 neighboring to the first pixel 130, the second pixel 134 includes a second pixel electrode 135, and the data line 121 is arranged between the first pixel electrode 131 and the second pixel electrode 135. The second pixel 134 further includes a second common electrode line 136 arranged between the first pixel electrode 131 and the second pixel electrode 135, and the second common electrode line 136 and the second pixel electrode 135 are on different layers and partially overlap each other.

The second common electrode line 136 is arranged on a side of the data line 121 away from the first common electrode line 132, and a second gap 137 is arranged between the second common electrode line 136 and the data line 121. The first shading layer 123 further blocks the second gap 137 and the second common electrode line 136, and extends beyond an edge of the second common electrode line 136 close to the second pixel electrode 135.

In this solution, the first common electrode line 132 and the second common electrode line 136 are respectively arranged on two sides of the data lines 121, the first gap 133 is arranged between the first common electrode line 132 and the data line 121, and the second gap 137 is arranged between the second common electrode line 136 and the data line 121. The first shading layer 123 not only blocks the first gap 133, the data line 121, and the first common electrode line 132, but also blocks the second gap 137 and the second common electrode line 136, and respectively extends beyond the edge of the first common electrode line 132 close to the first pixel electrode 131 and the edge of the second common electrode line 136 close to the second pixel electrode 135. This design can effectively block the positions where light leakage is likely to occur and the positions where mura occurs due to electric field shielding or other reasons on the first pixel 130 and the second pixel 134.

Specifically, the first common electrode line 132 and the second common electrode line 136 are each a segment of the pixel 124 corresponding to a common electrode on a first substrate 120, and are in communication with each other.

Figure 7:
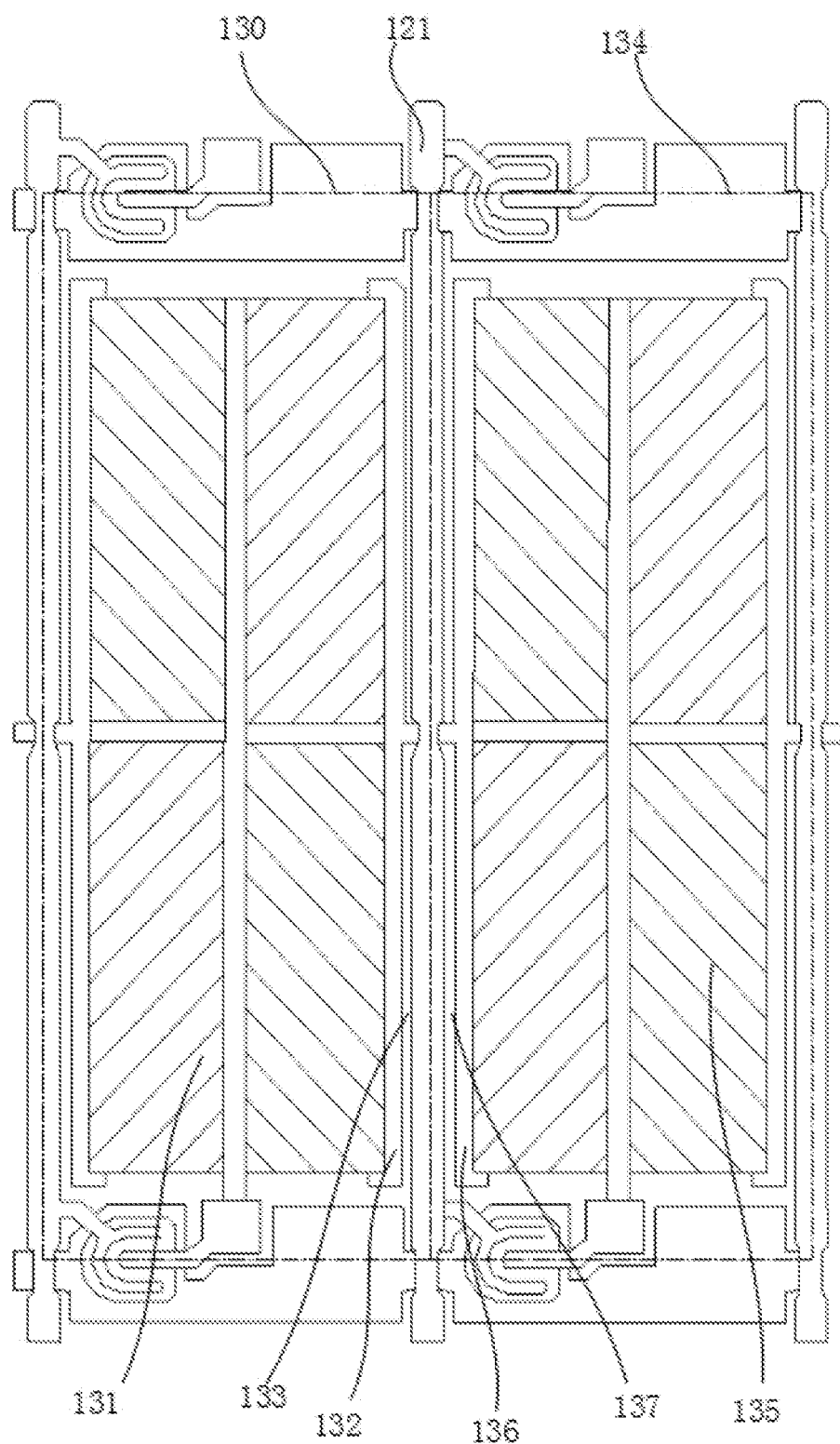
FIG. 7 is a schematic diagram of two pixels according to an embodiment of this application.
Figure 8:
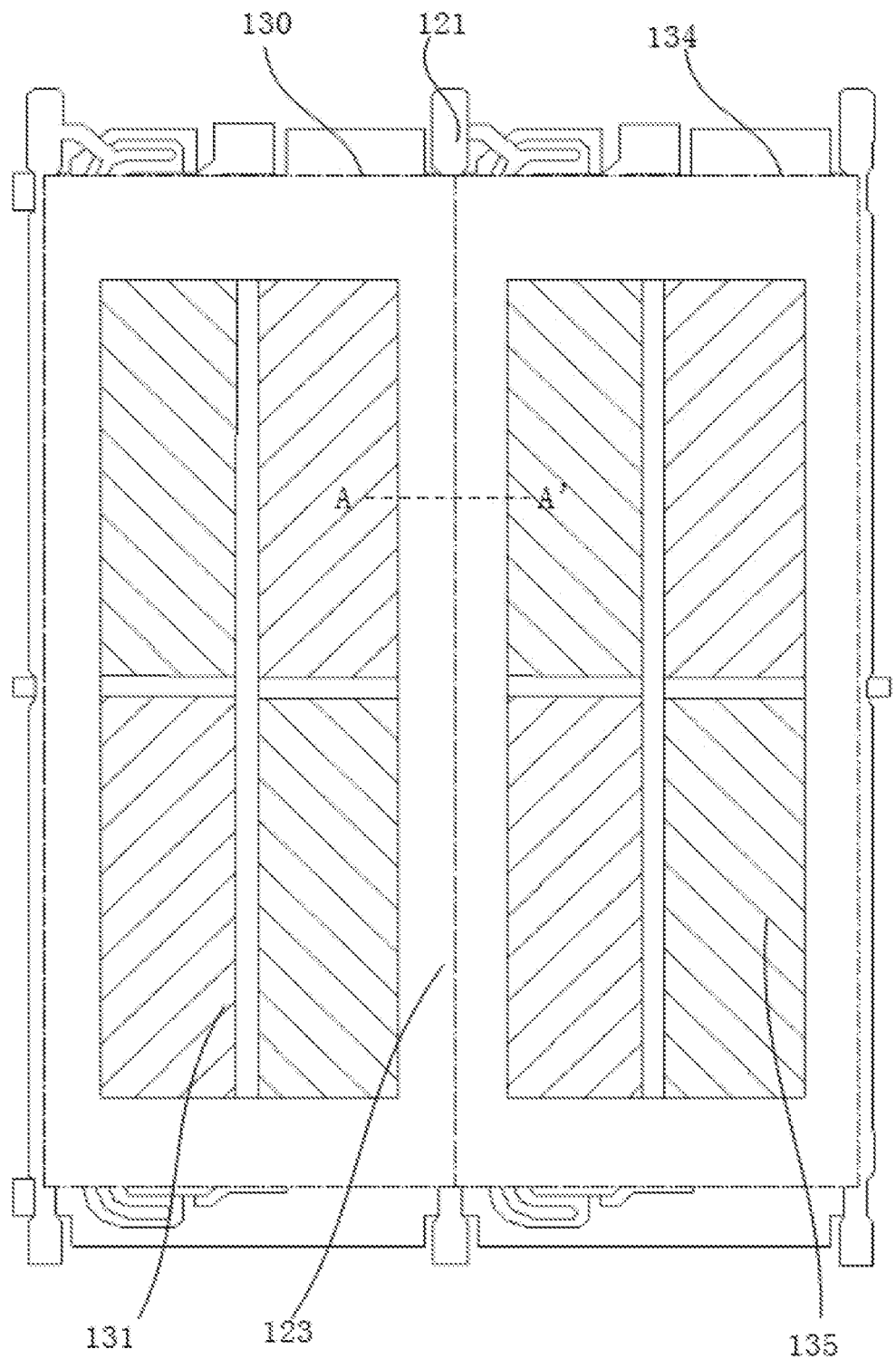
FIG. 8 is a schematic diagram of another two pixels according to an embodiment of this application.

As another embodiment of this application, referring to FIG. 7 and FIG. 8, different from the foregoing embodiments, the first substrate 120 includes a plurality of pixels 124, the scanning lines 122 are arranged corresponding to the pixels 124, and the pixel 124 includes a thin film transistor switch 126 connected to the scanning line 122. The first shading layer 123 further blocks the scanning line 122 and the thin film transistor switch 126.

In this solution, the thin film transistor switch 126 is generally arranged on the scanning line 122, and a width of the part at which the thin film transistor switch 126 is arranged may be equal to or greater than a width of the scanning line 122. If the width of the part at which the thin film transistor switch 126 is arranged is greater than the width of the scanning line 122, the part of the second shading layer 141 corresponding to the scanning line 122 is widened to block the thin film transistor switch 126.

As another embodiment of this application, different from the foregoing embodiments, the first substrate 120 includes a plurality of data lines 121 and a plurality of scanning lines 122; the first shading layer 123 is arranged on the first substrate 120 to block the data lines 121; and the second shading layer 141 is arranged on the second substrate 140 to block the scanning lines 122.

Because severe light leakage may occur at the data line 121, especially for an architecture in which a common electrode line 128 is arranged between pixel electrodes 125, arranging the first shading layer 123 at the data line 121 in this solution can effectively reduce light leakage. Light leakage at the corresponding scanning line 221 is mild, and because the wiring at the array substrate side is dense, the introduction of an additional structure may reduce the product yield. Arranging unnecessary structures such as a shading layer on the color film substrate side helps improve the product yield. In this solution, the second shading layer 141 may be arranged on the second substrate 140, so as to simplify the structure of the first substrate 120 while well preventing light leakage, thereby improving the yield of the display panel 110.

Specifically, the first shading layer 123 is arranged on the first substrate 120. The pixel 124 on the first substrate 120 includes a first pixel 130 and the data line 121 arranged on an outer side of the first pixel 130. The first pixel 130 includes a first pixel electrode 131 and a first common electrode line 132 arranged on an outer side of the first pixel electrode 131, and the first common electrode line 132 and the first pixel electrode 131 are on different layers and partially overlap each other. The first common electrode line 132 is arranged on a side of the data line 121, and a first gap 133 is arranged between the first common electrode line 132 and the data line 121. The first shading layer 123 blocks the data line 121, the first gap 133, and the first common electrode line 132, and extends beyond an edge of the first common electrode line 132 close to the first pixel electrode 131.

The pixel 124 of the first substrate 120 further includes a second pixel 134 neighboring to the first pixel 130, the second pixel 134 includes a second pixel electrode 135, and the data line 121 is arranged between the first pixel electrode 131 and the second pixel electrode 135. The second pixel 134 further includes a second common electrode line 136 arranged between the first pixel electrode 131 and the second pixel electrode 135, and the second common electrode line 136 and the second pixel electrode 135 are on different layers and partially overlap each other.

The second common electrode line 136 is arranged on a side of the data line 121 away from the first common electrode line 132, and a second gap 137 is arranged between the second common electrode line 136 and the data lines 121. The first shading layer 123 further blocks the second gap 137 and the second common electrode line 136, and extends beyond an edge of the second common electrode line 136 close to the second pixel electrode 135.

Figure 13:
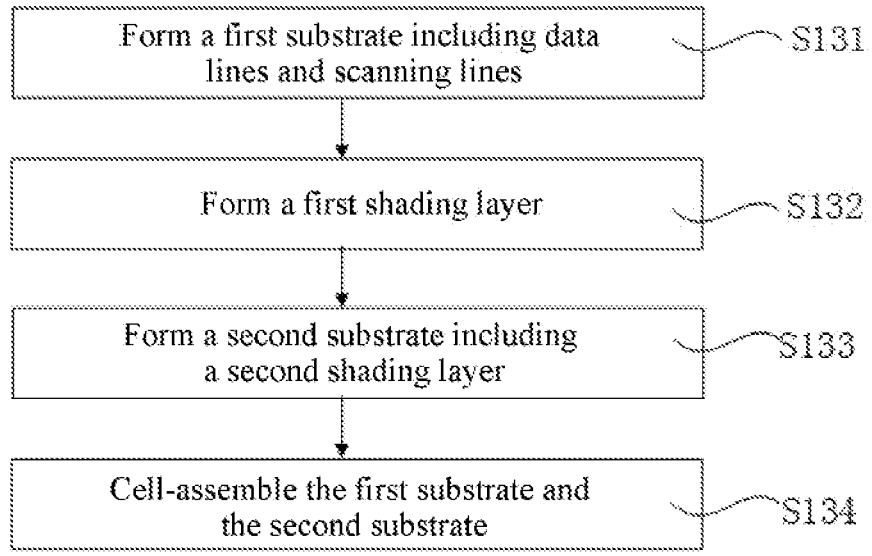
FIG. 13 is a flowchart of a method for manufacturing a display panel according to an embodiment of this application.

As another embodiment of this application, referring to FIG. 13, a method for manufacturing a display panel is disclosed, including:

S131: forming a first substrate including data lines and scanning lines;

S132: forming a first shading layer above the data lines and/or the scanning lines;

S133: forming a second substrate including a second shading layer;

S134: cell-assembling the first substrate and the second substrate, so that the second shading layer correspondingly blocks the data lines and/or the scanning lines.

Figure 12:
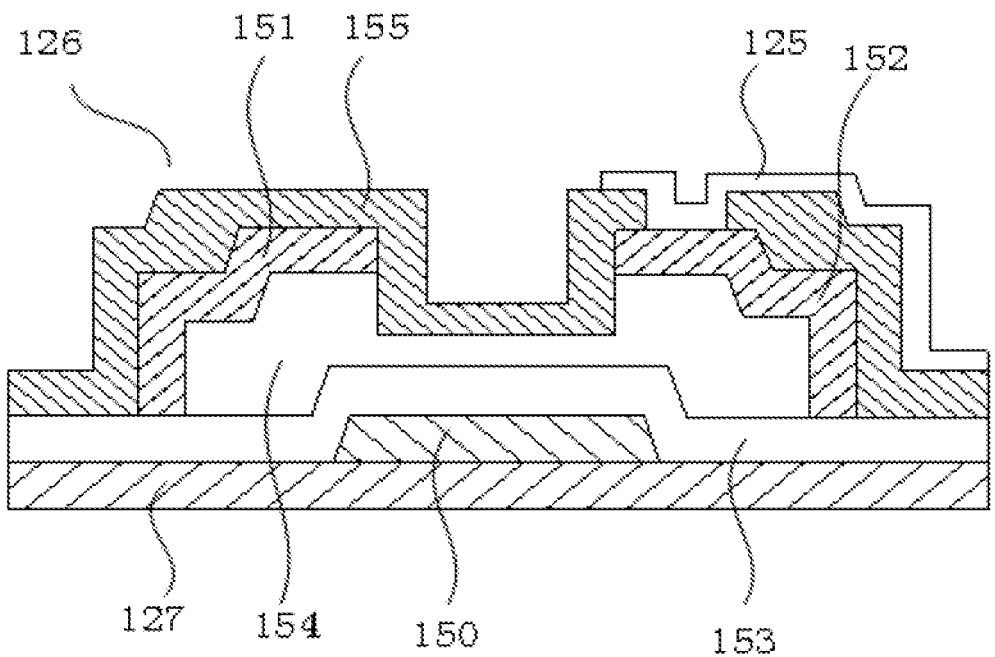
FIG. 12 is a schematic cross-sectional view of a thin film transistor switch according to an embodiment of this application.
Figure 14:
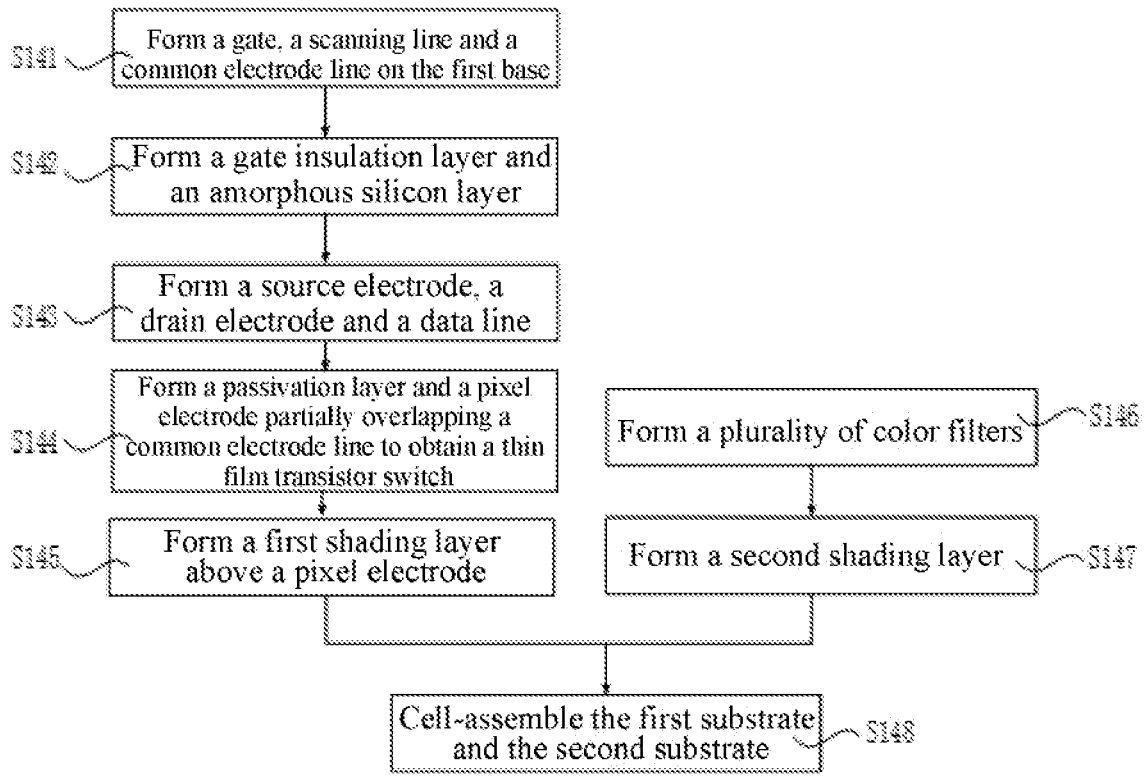
FIG. 14 is a flowchart of another method for manufacturing display panel according to an embodiment of this application.

As another embodiment of this application, referring to FIG. 1, FIG. 12, and FIG. 14, a method for manufacturing a display panel is disclosed, including a manufacture procedure of a first substrate and a manufacture procedure of a second substrate.

The manufacture procedure of the first substrate includes:

S141: forming a first base, and forming, on the first base, a gate, a scanning line that is on the same layer as the gate and connected to the gate, and a common electrode line;

S142: forming a gate insulation layer and an amorphous silicon layer above the gate;

S143: forming, above the amorphous silicon layer, a source electrode and a drain electrode that are arranged on the same layer, and data lines connected to the source electrode or the drain electrode;

S144: forming, above the source electrode and the drain electrode, a passivation layer and a pixel electrode 125 partially overlapping a common electrode line to obtain a thin film transistor switch; and S145: forming, above the pixel electrode, a first shading layer blocking the scanning lines, the data lines, and the common electrode line and extending beyond an edge of the common electrode line close to the pixel electrode.

The manufacture procedure of the second substrate includes:

S146: forming a plurality of color filters; and

S147: forming a second shading layer at a gap between the color filters;

The method for manufacturing a display panel further includes:

S148: cell-assembling the first substrate to the second substrate, so that the second shading layer corresponds to the first shading layer.

Figure 9:
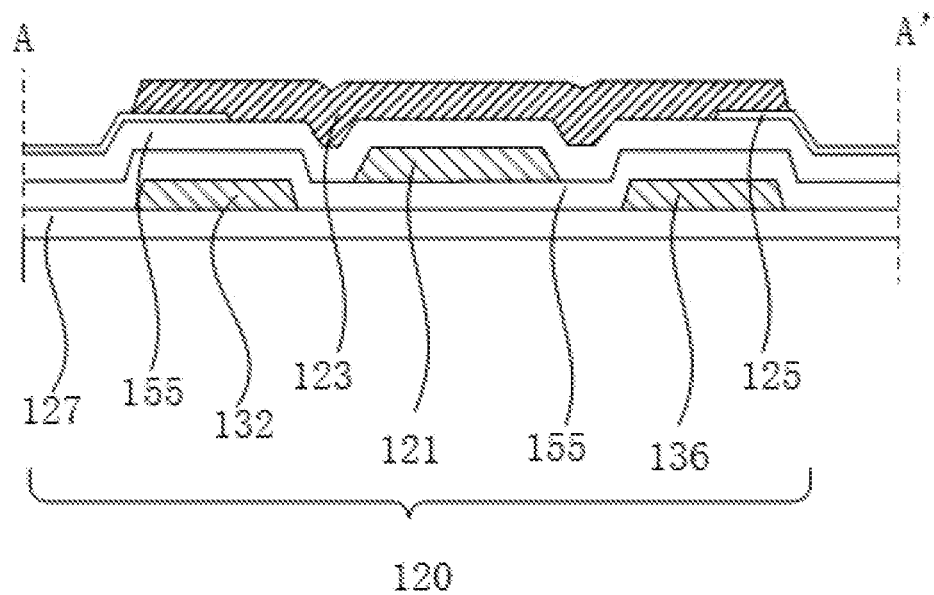
FIG. 9 is a schematic cross-sectional view taken along line A-A' according to an embodiment of this application.
Figure 10:
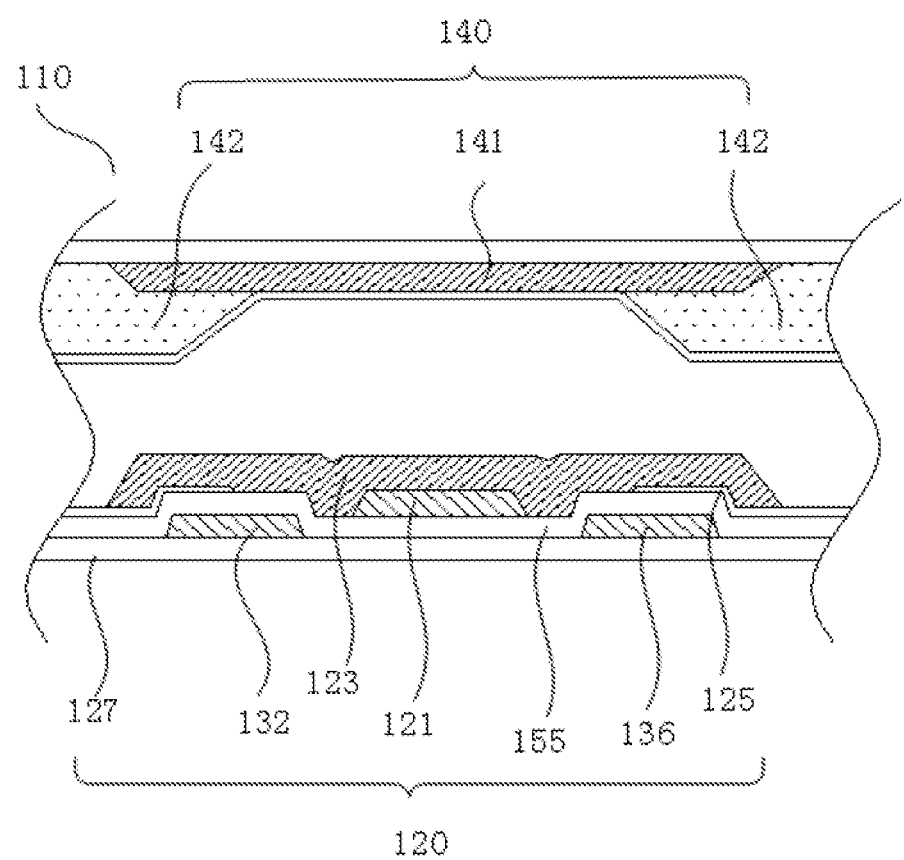
FIG. 10 is a schematic cross-sectional view of another display panel according to an embodiment of this application.
Figure 11:
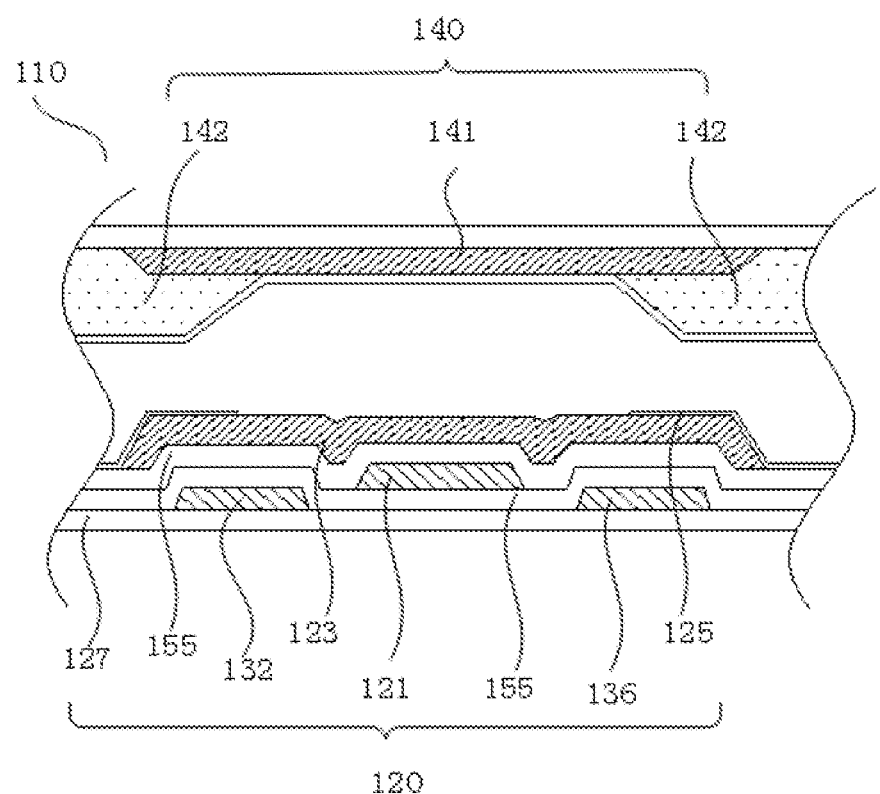
FIG. 11 is a schematic cross-sectional view of another display panel according to an embodiment of this application.

Specifically, an shown in FIG. 9 and FIG. 10, a passivation layer may be optionally arranged between the first shading layer and the data line.

Figure 15:
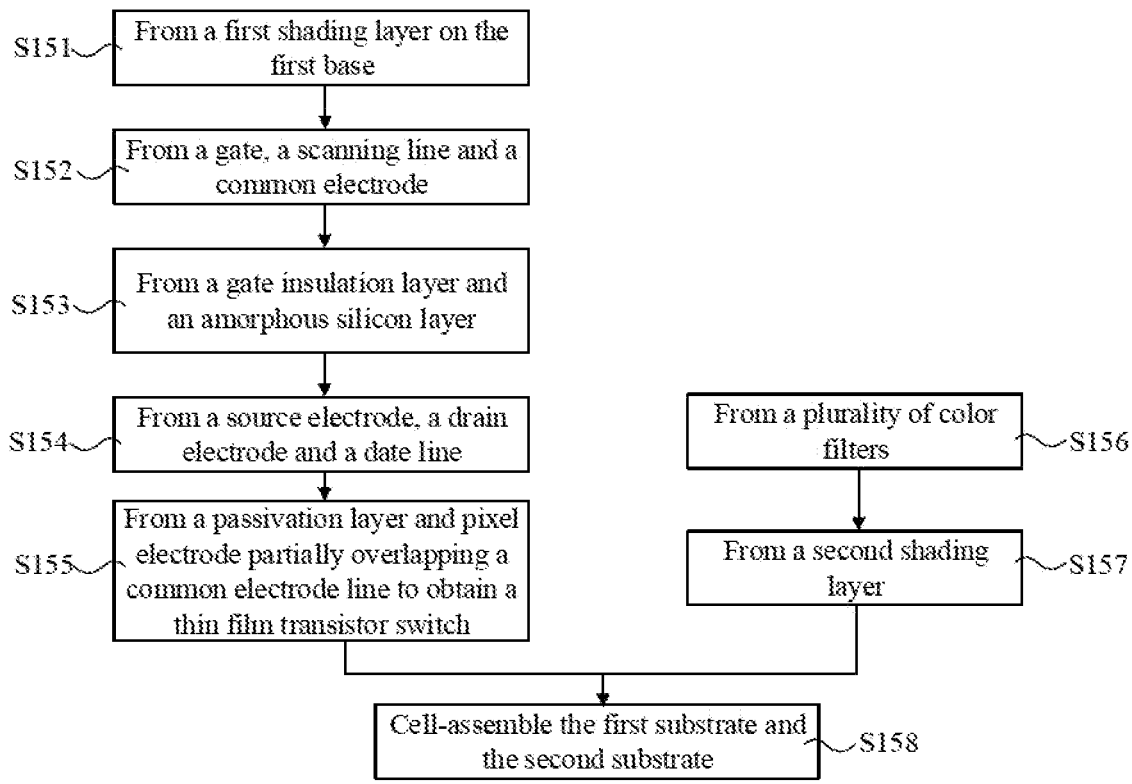
FIG. 15 is a flowchart of another method for manufacturing display panel according to an embodiment of this application.
Figure 16:
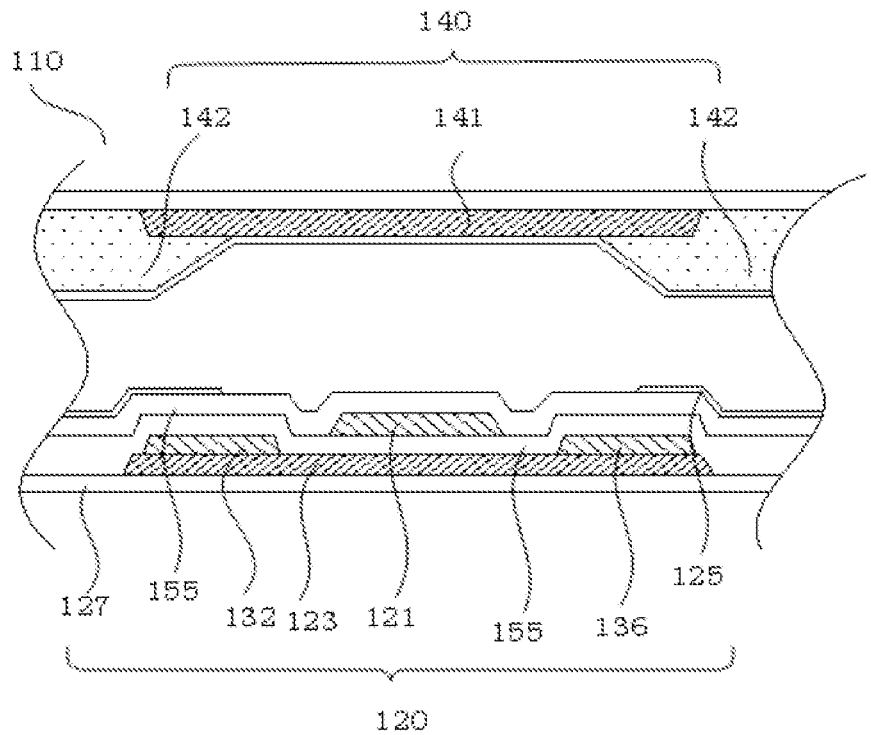
FIG. 16 is a schematic cross-sectional view of another display panel according to an embodiment of this application.

As another embodiment of this application, referring to FIG. 12, FIG. 15, and FIG. 16, a method for manufacturing a display panel is disclosed, including a manufacture procedure of a first substrate and a manufacture procedure of a second substrate.

The manufacture procedure of the first substrate includes:

S151: forming a first base and forming a first shading layer on the first base;

S152: forming, on the first base, a gate, a scanning line that is on the same layer as the gate and connected to the gate, and a common electrode line;

S153: forming a gate insulation layer and an amorphous silicon layer above the gate;

S154: forming, above the amorphous silicon layer, a source electrode and a drain electrode that are arranged on the same layer, and data lines 121 connected to the source electrode or the drain electrode; and S155: forming, above the source electrode and the drain electrode, a passivation layer and a pixel electrode 125 partially overlapping a common electrode line to obtain a thin film transistor switch.

The manufacture procedure of the second substrate includes:

S156: forming a plurality of color filters; and

S157: forming a second shading layer in a gap between the color filters.

The method for manufacturing a display panel further includes:

S158: cell-assembling the first substrate to the second substrate, so that the second shading layer corresponds to the first shading layer.

As another embodiment of this application, different from the foregoing embodiments, the first shading layer blocks the data line and the common electrode line, extends beyond an edge of the common electrode line close to a pixel electrode, and does not block the scanning line;

the second shading layer is formed between some color filters; and during cell-assembly, the second shading layer is made corresponding to the scanning line, to block the scanning line.

Figure 17:
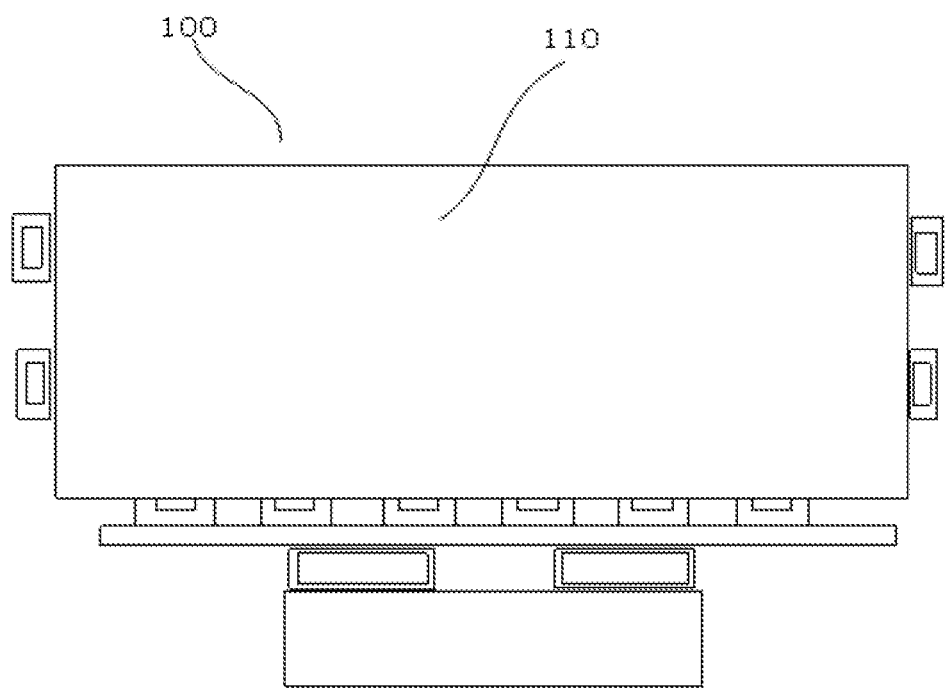
FIG. 17 is a schematic diagram of a display device according to an embodiment of this application.

As another embodiment of this application, referring to FIG. 17, this application discloses a display device 100, including any of the above display panels 110.

It should be noted that the limits of the steps involved in this solution are not determined as limiting the sequence of steps without affecting the implementation of the specific solution. The preceding steps can be executed first, later or even simultaneously. As long as the implementation of this solution can be carried out, they should all be considered as falling within the protection scope of this application.

The technical solution of the present invention can be widely used in various display panels, such as a twisted nematic (TN) display panel, an in-plane switching (IPS) display panel, a vertical alignment (VA) display panel, and a multi-domain vertical alignment (MVA) display panel. Certainly, the display panel can be a display panel of other types, such as an organic light-emitting diode (OLED) display panel. All of the foregoing display panels can be applied to the foregoing solutions.

The foregoing contents are detailed descriptions of this application in conjunction with specific optional embodiments, and it should not be considered that the specific implementation of this application is limited to these descriptions. Persons of ordinary skill in the art can further make simple deductions or replacements without departing from the concept of this application, and such deductions or replacements should all be considered as falling within the protection scope of this application.

What is claimed is:

1. A display panel, comprising:
a first substrate;
a second substrate, cell-assembled to the first substrate; and
a plurality of data lines and scanning lines, arranged on the first substrate, wherein
the first substrate comprises a first shading layer blocking the data lines or the scanning lines;
the second substrate comprises a second shading layer blocking the data lines or the scanning lines; and
each of the data lines and the scanning lines is blocked by at least one of the first shading layer and the second shading layer,
wherein the first shading layer is arranged to block of the data lines and the scanning lines in a one-to-one correspondence; the second shading layer is arranged to block all of the data lines and the scanning lines in a one-to-one correspondence; and
the first shading layer is arranged corresponding to the second shading layer,
the second substrate comprises a plurality of color filters, and the second shading layer is arranged between two neighboring color filters;
the first substrate comprises a plurality of pixels, the pixel comprises a pixel electrode, and the data lines and the scanning lines are arranged between two neighboring pixel electrodes; and
the second shading layer is arranged to correspondingly block the data lines or the scanning lines,
the pixel comprises a first pixel, and one of the data lines is arranged on an outer side of the first pixel;
the first pixel comprises a first pixel electrode and a first common electrode line arranged on an outer side of the first pixel electrode, and the first common electrode line and the first pixel electrode are on different layers and partially overlap each other;
the first common electrode line is arranged on a side of the data line, and a first gap is arranged between the first common electrode line and the data line; and
the first shading layer blocks the data line, the first gap, and the first common electrode line, and extends beyond an edge of the first common electrode line close to the first pixel electrode.

2. The display panel according to claim 1, wherein the first shading layer and the second shading layer have a same shape and a same size.

3. The display panel according to claim 1, wherein the pixel electrode is formed by a transparent conductive thin film.

4. The display panel according to claim 1, wherein the first shading layer is arranged above a first pixel electrode.

5. The display panel according to claim 1, wherein the first shading layer is arranged below a first pixel electrode.

6. The display panel according to claim 1, wherein the pixel comprises a second pixel neighboring the first pixel, the second pixel comprises a second pixel electrode, and the data line is arranged between the first pixel electrode and the second pixel electrode;
the second pixel further comprises a second common electrode line arranged between the first pixel electrode and the second pixel electrode, and the second common electrode line and the second pixel electrode are on different layers and partially overlap each other;
the second common electrode line is arranged on a side of the data line away from the first common electrode line, and a second gap is arranged between the second common electrode line and the data line; and
the first shading layer further blocks the second gap and the second common electrode line, and extends beyond an edge of the second common electrode line close to the second pixel electrode.

7. The display panel according to claim 1, wherein the first common electrode line and the second common electrode line are each a segment of a pixel corresponding to a common electrode on the first substrate, and are in communication with each other.

8. The display panel according to claim 1, wherein the first substrate comprises a plurality of pixels, the scanning line is arranged corresponding to the pixel, and the pixel comprises a thin film transistor switch connected to the scanning line; and
the first shading layer further blocks the scanning line and the thin film transistor switch.

9. The display panel according to claim 1, wherein the first substrate comprises a plurality of data lines and a plurality of scanning lines;
the first shading layer is arranged on a side of the first substrate to block the data lines; and
the second shading layer is arranged on a side of the second substrate to block the scanning lines.

10. A display device, comprising a display panel, wherein the display panel comprises:
a first substrate;
a second substrate, cell-assembled to the first substrate; and
a plurality of data lines and scanning lines, arranged on the first substrate;
the first substrate comprises a first shading layer blocking the data lines or the scanning lines;
the second substrate comprises a second shading layer blocking the data lines or the scanning lines; and
each of the data lines and the scanning lines is blocked by at least one of the first shading layer and the second shading layer,
wherein the first shading layer is arranged to block all of the data lines and the scanning lines in a one-to-one correspondence; the second shading layer is arranged to block all of the data lines and the scanning lines in a one-to-one correspondence; and the first shading layer is arranged corresponding to the second shading layer, the second substrate comprises a plurality of color filters, and the second shading layer is arranged between two neighboring color filters;

the first substrate comprises a plurality of pixels, the pixel comprises a pixel electrode, and the data lines and the scanning lines are arranged between two neighboring pixel electrodes; and the second shading layer is arranged to correspondingly block the data lines or the scanning lines, the pixel comprises a first pixel, and one of the data lines is arranged on an outer side of the first pixel;

the first pixel comprises a first pixel electrode and a first common electrode line arranged on an outer side of the first pixel electrode, and the first common electrode line and the first pixel electrode are on different layers and partially overlap each other;

the first common electrode line is arranged on a side of the data line, and a first gap is arranged between the first common electrode line and the data line; and the first shading layer blocks the data line, the first gap, and the first common electrode line, and extends beyond an edge of the first common electrode line close to the first pixel electrode.

* * * * *